(12) United States Patent
Thakur et al.

(10) Patent No.: US 7,791,914 B1
(45) Date of Patent: Sep. 7, 2010

(54) HIGH EFFICIENCY POWER SUPPLY FRONT END

(75) Inventors: Roshan Thakur, Sunnyvale, CA (US); Zoltan Zansky, Sunnyvale, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 547 days.

(21) Appl. No.: 11/906,429

(22) Filed: Oct. 1, 2007

(51) Int. Cl.
*H02M 7/217* (2006.01)
*H02M 5/42* (2006.01)
(52) U.S. Cl. .......................................... 363/127; 363/88
(58) Field of Classification Search .................. 363/52, 363/53, 77, 81, 88, 89, 127
See application file for complete search history.

(56) References Cited

U.S. PATENT DOCUMENTS

| | | | |
|---|---|---|---|
| 6,351,403 B2 * | 2/2002 | Abdoulin | 363/127 |
| 6,462,926 B1 * | 10/2002 | Zaretsky et al. | 361/103 |
| 6,788,554 B2 * | 9/2004 | Havanur | 363/21.06 |
| 7,379,282 B1 * | 5/2008 | Zansky | 361/82 |

* cited by examiner

*Primary Examiner*—Jessica Han
(74) *Attorney, Agent, or Firm*—Suiter Swantz pc llo

(57) ABSTRACT

A system for converting alternating electrical current to direct electrical current may include an input supply for supplying alternating electrical current. The input supply may be connected to a rectifier. The rectifier may be configured as a body diode. A comparator may be coupled to the rectifier. The comparator may apply a voltage to the rectifier when the input supply is operating.

24 Claims, 3 Drawing Sheets

HIGH EFFICIENCY POWER SUPPLY FRONT END

TECHNICAL FIELD

The present disclosure generally relates to the field of power conversion, and more particularly to a high efficiency front end for converting alternating electrical current to direct electrical current.

BACKGROUND

Electrical energy in the form of Alternating Current (AC) is a commonly available power source found in buildings, including homes. AC power is typically supplied by a central utility via power lines or from a physical plant that is part of a facility. For AC power, the electrical current switches directions a fixed number of times per second. However, many common devices, including electronics circuits and DC motors, utilize electrical energy in the form of Direct Current (DC), which is electrical current that flows in only one direction. Thus, it is often desirable to convert AC power to DC power.

SUMMARY

A system for converting alternating electrical current to direct electrical current may include an input supply for supplying alternating electrical current. The input supply may be connected to a front end for converting the alternating electrical current to direct electrical current. A rectifier bridge may comprise common rectifier diodes, or each diode of the rectifier bridge may be a FET transistor comprising an internal body diode of the FET. A comparator may be coupled to each FET of the rectifier bridge. An AC power source may be coupled to the rectifier bridge, and the output of the rectifier bridge may be input to the load of the rectifier bridge. In one implementation, the rectifier bridge may be utilized in an AC/DC switching power supply. The comparator may apply a voltage to the rectifier when the input supply is operating.

A method for converting alternating electrical current to direct electrical current may include defining a path between a first terminal and a second terminal of a transistor. If the FET gate is not energized or connected to its source, the path may allow electrical current to flow in only a first direction through the body diode of the FET when the transistor is in a first direction, and block the current path in a second direction. When the transistor is not turned on, it may have a first efficiency when conducting the electrical current in the first direction. When the transistor is turned on and conducting the electrical current in the first direction, it may have a second efficiency. The second efficiency of the transistor may be greater than the first efficiency. A comparator may be coupled across the gate-source of each FET transistor, turning on the transistors when the current flows through its body diode when the input supply is operating to convert the alternating electrical current to direct electrical current at the second efficiency of the transistor. Since the voltage drop through a turned on FET is much smaller than through an ordinary diode or the body diode of the FET, the power dissipation of each FET is much smaller than through an ordinary rectifier bridge. Thus, the efficiency of a rectifier bridge comprising four FETs versus an ordinary rectifier bridge may be much higher.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
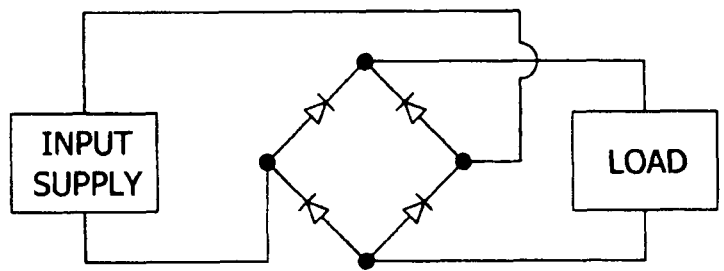
FIG. 1 is a diagram illustrating an ordinary rectifier bridge, including four ordinary diodes as known in the prior art.
Figure 2:
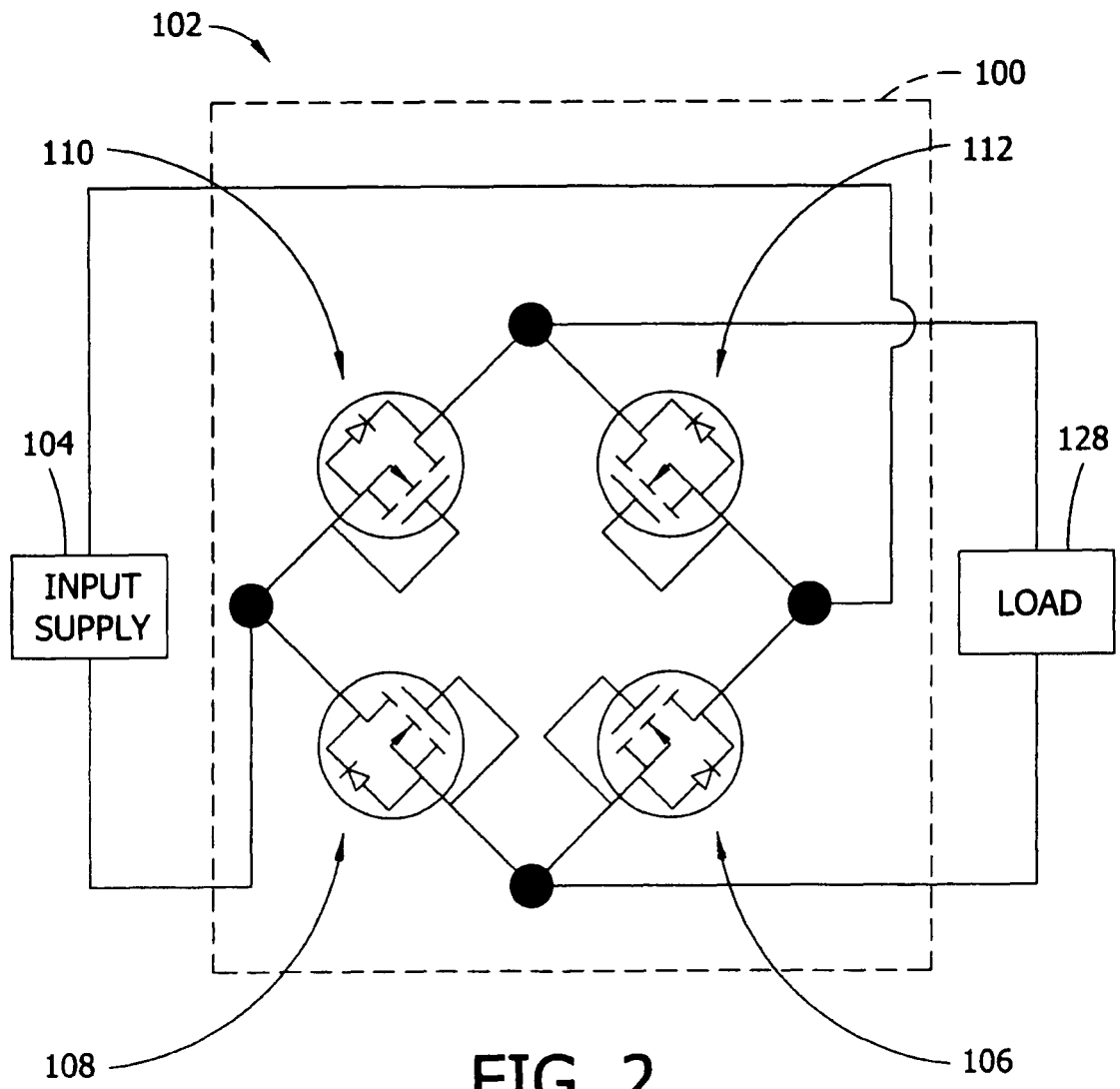
FIG. 2 is a diagram illustrating a rectifier bridge comprising four body diodes.
Figure 3:
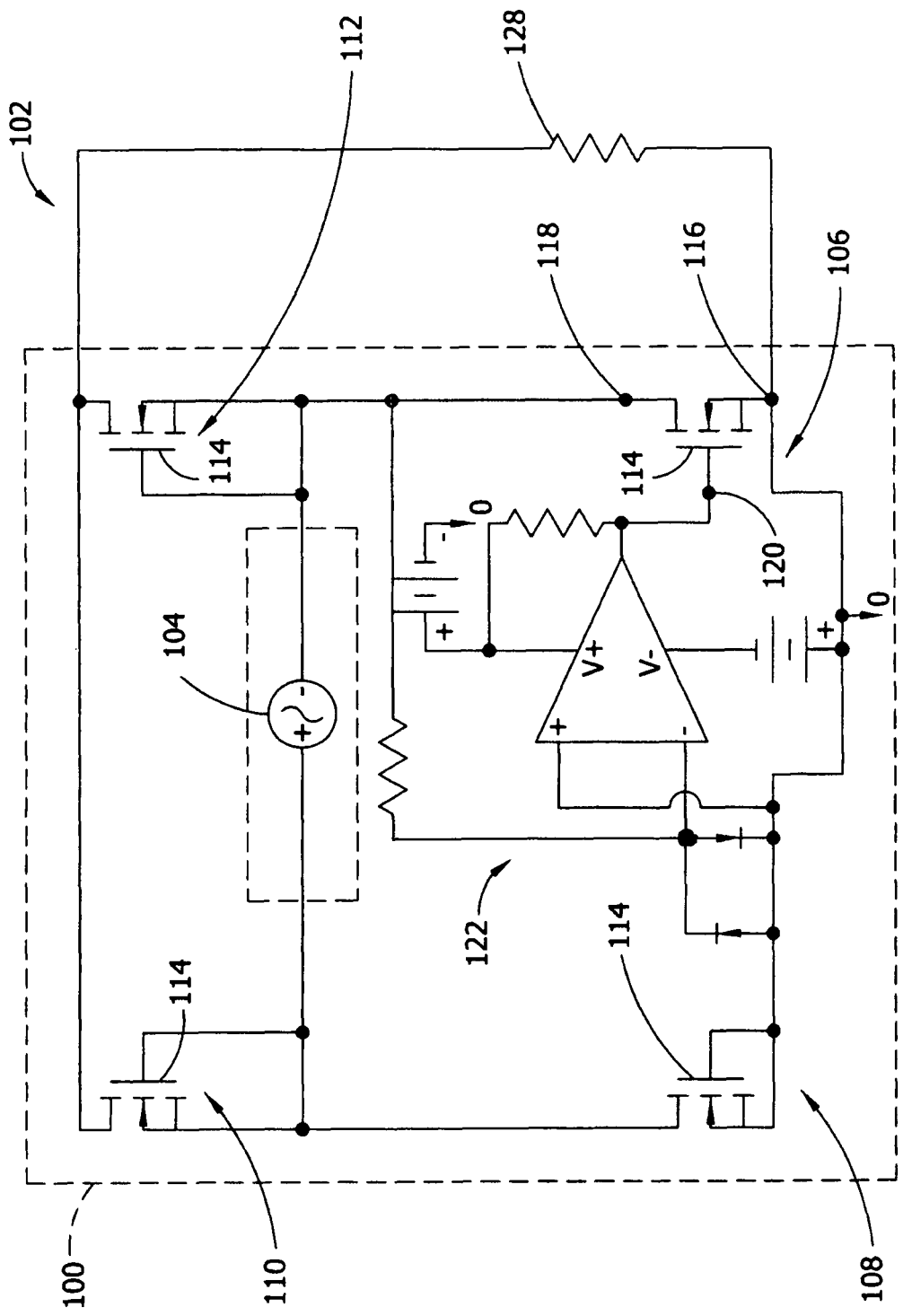
FIG. 3 is a circuit diagram illustrating a front end for converting alternating electrical current to direct electrical current, wherein the front end comprises four MOSFETs and a comparator circuit (it will be appreciated that although only one comparator is shown, each of the four MOSFETs may have its own comparator functioning identically)
Figure 4:
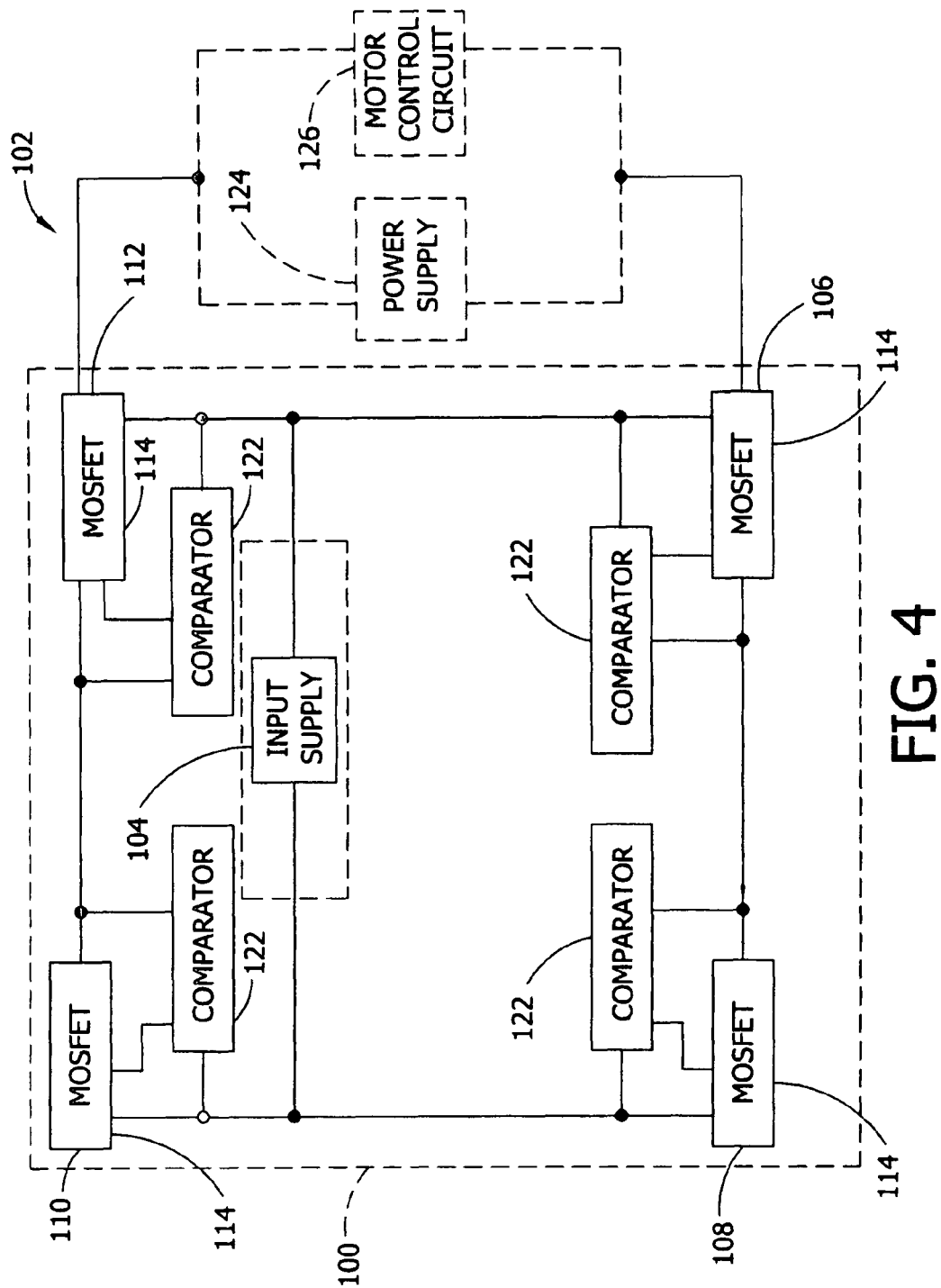
FIG. 4 is a block diagram illustrating a front end for converting alternating electrical current to direct electrical current, wherein the front end comprises a number of rectifiers paired with comparators.

Referring generally to FIGS. 2 through 4, a front end 100 for a system 102 that converts alternating electrical current (AC) to direct electrical current (DC) is described. A rectifier is a device for converting AC power to DC power. A rectifier may be utilized with other devices to convert the AC power to a suitable form of DC power. A transformer may be utilized to convert AC supplied from AC mains at a first voltage to AC having a second voltage. The second voltage is often lower than the first voltage. A rectifier may be utilized to convert the AC at the second voltage to DC having a varying output. The varying DC may be full-wave in the case of a bridge rectifier. A capacitor may be utilized to smooth the varying DC to smoothed DC having an average voltage of almost the peak value of the varying DC. Finally, a voltage regulator may be utilized for eliminating ripples in the smoothed DC and setting the DC output to a fixed voltage.

Utilizing devices such as transformers, rectifiers, capacitors, and regulators, high voltage electrical power from AC mains can be converted to lower voltage DC power suitable for electronics circuits, DC motors, and other devices. Thus, these components are often utilized with power supplies for these devices.

The system 102 may comprise an input supply 104 for supplying AC to the front end 100. The input supply 104 may provide electrical energy in the form of AC supplied by a central utility via power lines, from a physical plant that is part of a facility, or from another source of electrical power. The AC may switch directions a fixed number of times per second. A transformer may be utilized to convert AC supplied from AC mains at a first voltage to AC having a second voltage. The second voltage may be lower than the first voltage. It will be appreciated that AC may be supplied to the front end 100 at the first voltage, the second voltage, or at another voltage as desired. The front end 100 may be configured to function as a full-wave rectifier, such as an AC rectifier bridge.

The front end 100 may include a first rectifier 106, a second rectifier 108, a third rectifier 110, and a fourth rectifier 112. The first rectifier 106, the second rectifier 108, the third rectifier 110, and the fourth rectifier 112 may be connected to the input supply 104. The third rectifier 110 may be connected in series with the input supply 104. The first rectifier 106 and the third rectifier 110 may allow electrical current to flow through them when the polarity of the AC source 104 is positive toward the third rectifier 110. The second rectifier 108 and the fourth rectifier 112 may allow electrical current to flow through them when the polarity of the AC source 104 is positive toward the fourth rectifier 112. The first rectifier 106, the second rectifier 108, the third rectifier 110, and/or the fourth rectifier 112 may comprise a diode or a Metal-Oxide Semiconductor Field-Effect Transistor (MOSFET) 114.

The first rectifier 106 may comprise a first terminal 116 (source terminal), a second terminal 118 (drain terminal), and a third terminal 120 (gate terminal). The first terminal 116 and the second terminal 118 may define a path through the first rectifier 106 that allows electrical current to flow through it when the polarity of the AC source 104 is negative toward the second terminal 118 when the first rectifier 106 is in an on state. The path defined through the first rectifier 106 via the first terminal 116 and the second terminal 118 may block electrical current from flowing through it when the polarity of the AC source 104 reverses. It will be appreciated that if none of the MOSFETs 114 are in an on state, rectification may also take place through the MOSFETs' parallel parasitic internal diodes, but the voltage drop through these diodes may be much greater compared to when the diodes are shunted by the turned on MOSFETs 114.

A comparator 122 may be coupled to each one of the first rectifier 106, the second rectifier 108, the third rectifier 110, and the fourth rectifier 112. To turn on each one of the MOSFETs 114, the comparator 122 coupled with each MOSFET may sense the voltage across the body diode of each MOSFET 114 and turn the MOSFET on, when their drain is negative compared to their sources. When the comparator 122 applies a voltage to the first rectifier 106, the first rectifier 106 may be turned on. For example, the comparator 122 may be coupled across the first terminal 116 and the third terminal 120 of the first rectifier 106. When the comparator 122 applies a voltage between the first terminal 116 and the third terminal 120 of the first rectifier 106, the first rectifier 106 may be turned on. In this manner, the comparator 122 may be utilized for applying a voltage to the first rectifier 106 when the input supply 104 is operating to convert AC power to DC power more efficiently than when the first rectifier 106 are turned off and rectification occurs through the MOSFETs' parallel parasitic internal diodes.

The system 102 may comprise a power supply 124, a load 128 (shown as a resistor on the right side of the rectifier bridge illustrated in FIG. 3) such as a 120V switching power supply, and/or a DC motor control circuit 126. Alternatively, the system 102 may comprise another destination (load) for the DC supplied by the front end 100. Thus, the power supply 124, the DC motor control circuit 126, or a like device may be coupled to the front end 100, and the output of the front end 100 may be input thereto. It will be appreciated that the output of the front end 100 may comprise a full-wave varying DC signal. Further, the first rectifier 106, the second rectifier 108, the third rectifier 110, and the fourth rectifier 112 may be included on an Integrated Circuit (IC) comprising the front end 100.

The input supply 104 may comprise a 100 volt (V), 50 hertz (Hz) AC source. The 100V/50 Hz AC source may be connected to the front end 100. The first rectifier 106, the second rectifier 108, the third rectifier 110, and the fourth rectifier 112 of the front end 100 may comprise N-Channel Field-Effect Transistors (FETs). Each of the N-Channel FETs may comprise a regular parallel diode in its semiconductor structure. The diode anode may be connected to the FET's source terminal (i.e., first terminal 116), and the diode cathode may be connected to the FET's drain terminal (i.e., second terminal 118). Each such N-Channel FET may comprise an IRF250 MOSFET. Together, the internal parallel diodes of the first, second, third, and fourth MOSFETs may comprise a rectifier bridge.

It is contemplated that each gate terminal (i.e., third terminal 120) of a FET may be connected to the source terminal of the FET. In this configuration, the FET will not turn on (i.e., operate in its on state), but the parallel diode of the FET will function like a diode. Together, four FETs may comprise a rectifier bridge in their off states. A load comprising a 50 ohm resistor that draws 200 watts (W) may be connected to a rectifier bridge constructed in this manner. The 50 ohm resistor may be utilized to represent a coupled power supply and its load. A comparator circuit, such as the comparator 122, may be utilized for measuring the voltage across a MOSFET. If the voltage across the FET is negative when the FET's body diode is conducting, the output of the comparator 122 is high. Conversely, if the voltage across the FET is positive, the FET is off or its body diode is not conducting. It should be noted that in such a configuration, the output of the comparator circuit would not be connected to the FET's gate terminal, and the FETS would not be in an on state, but, together their body diodes may function as an AC rectifier bridge.

In this configuration, there may be a 0.7V peak voltage drop across the body diode of each FET, and the current through it may have a peak value of three amperes (A). The power dissipation of the diode may have a peak value of two watts (W), and the root mean square (RMS) power over one AC cycle may be one watt. Thus, in this configuration, the total four diode losses may be four watts. This four watt loss may comprise 2% additional losses to the 200 W power supply represented by the 50 ohm resistor.

FIG. 3 illustrates a configuration in which the comparator 122 is connected to the gate terminal of the first rectifier 106. In this configuration, when the comparator output drive is positive, the FET is turned on (i.e., configured to operate in its on state), which shunts the body diode of the FET. Thus, the FET total dissipation may be reduced to ¼th or 500 milliwatts (mW) peak, or 200 mW average, a substantial reduction of losses. This may increase the efficiency of the power supply. It will be appreciated that each of the second, third, and fourth rectifiers may also be connected to a comparator and operated in the same way, as shown in FIG. 4. In this configuration, the total dissipation may be 800 mW average. Thus, the efficiency loss may be reduced from 2% to 0.4%, which would be a substantial five-fold improvement.

One or more N-Channel FETs may be utilized with other hardware that allows the electrical current supplied by the input supply 104 to flow through it in only one direction. One FET may be utilized with three conventional diodes, three Schottky diodes, or other suitable rectifier devices. Two FETs may be utilized with two conventional diodes, two Schottky diodes, or other suitable rectifier devices. Further, three FETs may be utilized with one conventional diode, one Schottky diode, or another suitable rectifier device. It will be appreciated that a variety of combinations of FETs may be utilized with the front end 100.

The power supply 124 may include a device for smoothing the varying DC signal from the front end 100. A large value electrolytic capacitor may be utilized for smoothing the varying DC signal. It will be appreciated that the smoothed DC signal may still have a ripple due to the charging and discharging of the capacitor. For this reason, a voltage regulator may be utilized to fix the voltage of the DC at a specific level. It should be noted that other devices for conditioning the signal supplied by the front end 100 may be utilized as well.

While a rectifier has been described as comprising a transistor, such as a MOSFET 114, the rectifier may also comprise one or more transistors, one or more diodes, or other devices for converting AC to DC. Further, each of these transistors, diodes, or the like may be configured as body diodes. It will also be appreciated that a rectifier may include additional hardware and/or be combined with comparator 122. For example, the first rectifier 106 and a comparator 122 may be combined in a single device. Thus, the first rectifier 106 and the comparator 122 may be provided as a single component or a combined assembly, such as a component for mounting to an integrated circuit board.

While the front end 100 has been described as including four rectifiers, it will be appreciated that the front end 100 may include more or fewer rectifiers. The front end 100 may include one rectifier 106, two rectifiers, three rectifiers, or more rectifiers. Further, it will be appreciated that the rectifiers may be arranged in a variety of ways with reference to the input supply 104. The one or more rectifiers may be arranged in serial and/or in parallel with one another and with the input supply 104 as needed.

A method for converting alternating electrical current (AC) to direct electrical current (DC) is described. The method may comprise defining a path between a first terminal (source terminal) and a second terminal (drain terminal) of a transistor. The transistor may comprise a body diode, or a like configuration, such that the path allows electrical current to flow through the body diode when the transistor is in a first state (off state) and through the path between the source terminal and the drain terminal when the transistor is in a second state (on state). The transistor may have a first efficiency when conducting the electrical current in the off state and a second efficiency when conducting the electrical current in the on state. The second efficiency of the transistor may be greater than the first efficiency. Next, the transistor is connected in parallel with an input supply for supplying alternating electrical current to the transistor. A comparator is coupled across the first terminal (source terminal) and a third terminal (gate terminal) of the transistor. Finally, a voltage is applied between the first terminal and the third terminal of the transistor when the input supply is operating. In this manner, the alternating current supplied by the input supply is converted to direct current at the second efficiency of the transistor.

It is believed that the high efficiency power supply front end of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A rectifier bridge, comprising:
   a first rectifier comprising a first body diode, the first rectifier coupled to a first comparator;
   a second rectifier comprising a second body diode, the second rectifier coupled to a second comparator;
   a third rectifier comprising a third body diode, the third rectifier coupled to a third comparator;
   a fourth rectifier comprising a fourth body diode, the fourth rectifier coupled to a fourth comparator;
   wherein the first comparator applies a voltage to the first rectifier when it senses electrical current through the first body diode, the second comparator applies a voltage to the second rectifier when it senses electrical current through the second body diode, the third comparator applies a voltage to the third rectifier when it senses electrical current through the third body diode, and the fourth comparator applies a voltage to the fourth rectifier when it senses electrical current through the fourth body diode, wherein said first rectifier, said second rectifier, said third rectifier and said fourth rectifier operate at a first efficiency, said first rectifier, said second rectifier, said third rectifier and said fourth rectifier operate at a second efficiency when said first comparator, said second comparator, said third comparator and said fourth comparator applies said voltage to said first rectifier, said second rectifier, said third rectifier and said fourth rectifier, said second efficiency being a higher efficiency than said first efficiency.

2. The rectifier bridge as claimed in claim 1, wherein the output of the rectifier bridge comprises full-wave direct electrical current.

3. The rectifier bridge as claimed in claim 1, wherein at least one of the first rectifier, the second rectifier, the third rectifier, and the fourth rectifier comprises a metal-oxide-semiconductor field-effect transistor (MOSFET).

4. A method, comprising:
   defining a path between a first terminal and a second terminal of a transistor comprising a body diode, the path allowing electrical current to flow through the body diode when the transistor is in a first state to shunt the body diode when the transistor is in a second state;
   connecting the transistor to an input supply for supplying alternating electrical current;
   coupling a comparator across the first terminal and a third terminal of the transistor; and
   applying a voltage between the first terminal and the third terminal of the transistor when the input supply is operating to convert the alternating electrical current to direct electrical current at the second efficiency of the transistor, wherein the transistor has a first efficiency when conducting the electrical current in the first state and a second efficiency when conducting the electrical current in the second state, the second efficiency of the transistor being greater than the first efficiency.

5. The method as claimed in claim 4, further comprising coupling at least one of a power supply and a motor control circuit to the rectifier, wherein the output of the rectifier is input to the at least one of the power supply and the motor control circuit.

6. The method as claimed in claim 5, further comprising connecting a second transistor in parallel with the input supply, connecting a third transistor in parallel with the input supply, and connecting a fourth transistor in parallel with the input supply, wherein the outputs of the second transistor, the third transistor, and the fourth transistor are input to the at least one of the power supply and the motor control circuit.

7. The method as claimed in claim 6, wherein the input to the power supply comprises full-wave direct electrical current.

8. The method as claimed in claim 4, wherein the transistor comprises a metal-oxide-semiconductor field-effect transistor (MOSFET).

9. The method as claimed in claim 8, wherein the first terminal comprises a source terminal, the second terminal comprises a drain terminal, and the third terminal comprises a gate terminal.

10. The method as claimed in claim 8, wherein the first state of the transistor comprises an off state, and the second state of the transistor comprises an on state.

11. A system, comprising:
an input supply for supplying alternating electrical current;
a rectifier connected to the input supply, the rectifier allowing electrical current to flow through a body diode when the rectifier is in a first state and to shunt the body diode when the rectifier is in a second state; and
a comparator coupled to the rectifier,
wherein the comparator applies a voltage to the rectifier when the input supply is operating to convert the alternating electrical current to direct electrical current at the second efficiency of the rectifier, the rectifier having a first efficiency when conducting the electrical current in the first state and a second efficiency when conducting the electrical current in the second state, the second efficiency of the rectifier being greater than the first efficiency.

12. The system as claimed in claim 11, further comprising at least one of a power supply and a motor control circuit coupled to the rectifier, wherein the output of the rectifier is input to the at least one of the power supply and the motor control circuit.

13. The system as claimed in claim 12, further comprising a second rectifier connected to the input supply, a third rectifier connected to the input supply, and a fourth rectifier connected to the input supply, wherein the outputs of the second rectifier, the third rectifier, and the fourth rectifier are input to the at least one of the power supply and the motor control circuit.

14. The system as claimed in claim 13, wherein the input to the at least one of the power supply and the motor control circuit comprises full-wave direct electrical current.

15. The system as claimed in claim 11, wherein the rectifier comprises a transistor.

16. The system as claimed in claim 15, wherein the transistor comprises a metal-oxide semiconductor field-effect transistor (MOSFET).

17. The system as claimed in claim 15, wherein the first state of the rectifier comprises an off state for the transistor, and the second state of the rectifier comprises an on state for the transistor.

18. A system, comprising:
an input supply for supplying alternating electrical current;
a rectifier connected to the input supply, the rectifier comprising a body diode that operates at a first efficiency;
a comparator coupled to the rectifier; and
a power supply coupled to the rectifier, the output of the rectifier being input to the power supply,
wherein the comparator applies a voltage to the rectifier when the input supply is operating to shunt the body diode and operate at a second efficiency, wherein said second efficiency is a higher efficiency than said first efficiency.

19. The system as claimed in claim 18, further comprising a second rectifier connected to the input supply, a third rectifier connected to the input supply, and a fourth rectifier connected to the input supply, wherein the outputs of the second rectifier, the third rectifier, and the fourth rectifier are input to the power supply.

20. The system as claimed in claim 19, wherein the second rectifier comprises a transistor.

21. The system as claimed in claim 19, wherein the input to the power supply comprises full-wave direct electrical current.

22. The system as claimed in claim 18, wherein the rectifier comprises a first terminal, a second terminal, and a third terminal, the first terminal and the second terminal defining a path through the rectifier allowing electrical current to flow through the body diode when the rectifier is in a first state and through a path between the first terminal and the second terminal when the rectifier is in a second state, and wherein the comparator is connected across the first terminal and the third terminal.

23. The system as claimed in claim 18, wherein the rectifier comprises a transistor.

24. The system as claimed in claim 23, wherein the transistor comprises a metal-oxide semiconductor field-effect transistor (MOSFET).

* * * * *